US010217695B2

(12) United States Patent
Meyer et al.

(10) Patent No.: US 10,217,695 B2
(45) Date of Patent: Feb. 26, 2019

(54) CONNECTOR BLOCK WITH TWO SORTS OF THROUGH CONNECTIONS, AND ELECTRONIC DEVICE COMPRISING A CONNECTOR BLOCK

(71) Applicant: Infineon Technologies AG, Neubiberg (DE)

(72) Inventors: Thorsten Meyer, Regensburg (DE); Klaus Pressel, Regensburg (DE); Maciej Wojnowski, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/367,920

(22) Filed: Dec. 2, 2016

(65) Prior Publication Data

US 2017/0162476 A1 Jun. 8, 2017

(30) Foreign Application Priority Data

Dec. 3, 2015 (DE) ......................... 10 2015 121 044

(51) Int. Cl.
*H01L 23/48* (2006.01)
*H01L 21/78* (2006.01)
*H01L 23/31* (2006.01)
*H01L 23/495* (2006.01)
(Continued)

(52) U.S. Cl.
CPC ............ *H01L 23/481* (2013.01); *H01L 21/78* (2013.01); *H01L 23/3157* (2013.01); *H01L 23/49541* (2013.01); *H01L 24/96* (2013.01); *H01L 24/97* (2013.01); *H01L 21/568* (2013.01); *H01L 2224/04105* (2013.01); *H01L 2224/12105* (2013.01); *H01L 2224/16227* (2013.01); *H01L 2224/18* (2013.01); *H01L 2225/1035* (2013.01);
(Continued)

(58) Field of Classification Search
CPC ............................. H01L 23/481; H01L 21/78
See application file for complete search history.

(56) References Cited

U.S. PATENT DOCUMENTS 5,037,311 A    8/1991  Frankeny et al.
7,619,901 B2 * 11/2009 Eichelberger ....... H01L 21/6835
                                                    361/763
8,866,292 B2   10/2014 Beer et al.
(Continued)

FOREIGN PATENT DOCUMENTS

CN          1430462 A      7/2003
CN        101221949 A      7/2008
(Continued)

OTHER PUBLICATIONS

English language translation of Abstracts for CN 1430462 A, CN 101714554 A, CN 106847786 A, CN 101221949 A and DE 10249855 A1.

Primary Examiner — Dung Le

(57) ABSTRACT

An electronic device comprising a semiconductor package having a first main surface region and a second main surface region and comprising a semiconductor chip comprising at least one chip pad in the second main surface region and a connector block comprising at least one first electrically conductive through connection and at least one second electrically conductive through connection extending with different cross-sectional areas between the first main surface region and the second main surface region and being arranged side-by-side with the semiconductor chip.

13 Claims, 7 Drawing Sheets

(51) Int. Cl.
*H01L 23/00* (2006.01)
*H01L 21/56* (2006.01)

(52) U.S. Cl.
CPC ............... *H01L 2225/1041* (2013.01); *H01L 2225/1058* (2013.01); *H01L 2924/18162* (2013.01)

(56) References Cited

U.S. PATENT DOCUMENTS

| | | |
|---|---|---|
| 2002/0079513 A1 | 6/2002 | Tao |
| 2006/0138462 A1 | 6/2006 | Choi |
| 2008/0246126 A1* | 10/2008 | Bowles .............. H01L 23/3114 257/659 |
| 2012/0153499 A1* | 6/2012 | Byun .................... H01L 25/105 257/774 |
| 2012/0162825 A1* | 6/2012 | Contreras .............. G11B 5/486 360/245.8 |
| 2012/0208319 A1 | 8/2012 | Meyer et al. |
| 2013/0009325 A1 | 1/2013 | Mori et al. |
| 2013/0119555 A1 | 5/2013 | Sundaram et al. |
| 2014/0035935 A1 | 2/2014 | Shenoy et al. |
| 2014/0103527 A1* | 4/2014 | Marimuthu ......... H01L 23/3121 257/737 |
| 2015/0171033 A1 | 6/2015 | Seler et al. |
| 2015/0194388 A1* | 7/2015 | Pabst .................... H01L 23/552 257/659 |
| 2016/0181188 A1* | 6/2016 | Lin ................... H01L 23/49827 174/262 |
| 2016/0316557 A1* | 10/2016 | Lee ........................ H05K 1/181 |

FOREIGN PATENT DOCUMENTS

| | | |
|---|---|---|
| CN | 101714554 A | 5/2010 |
| CN | 106847786 A | 6/2017 |
| DE | 10249855 A1 | 5/2004 |
| DE | 102005043557 B4 | 3/2007 |
| DE | 102011001405 A1 | 10/2011 |
| EP | 2722876 A2 | 4/2014 |
| JP | 2005285945 A | 10/2005 |

* cited by examiner

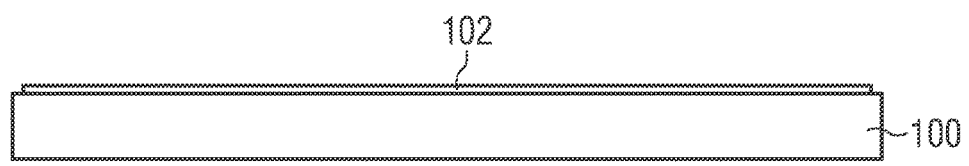
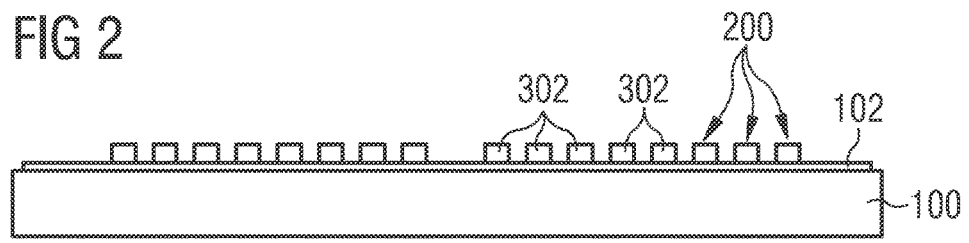
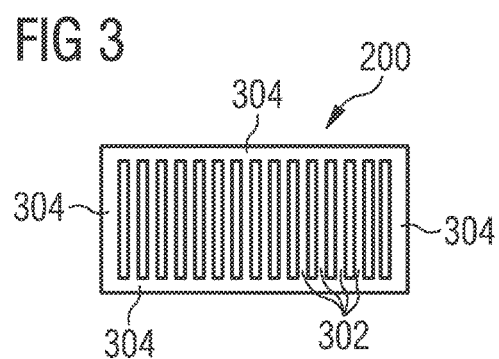

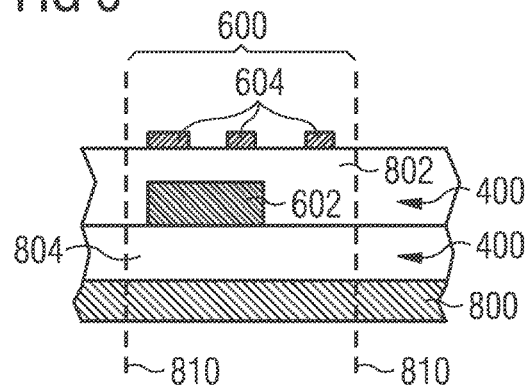
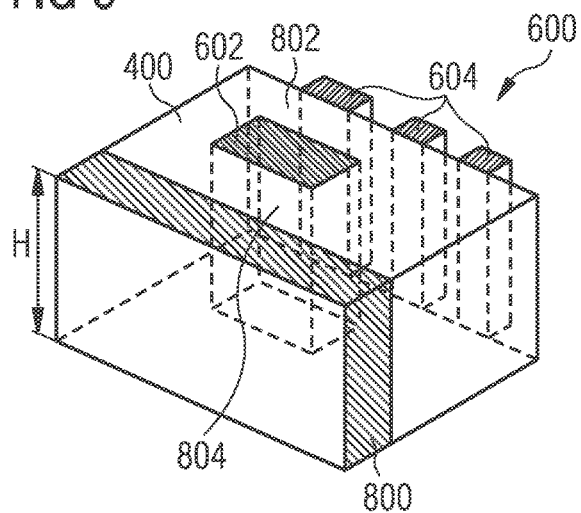
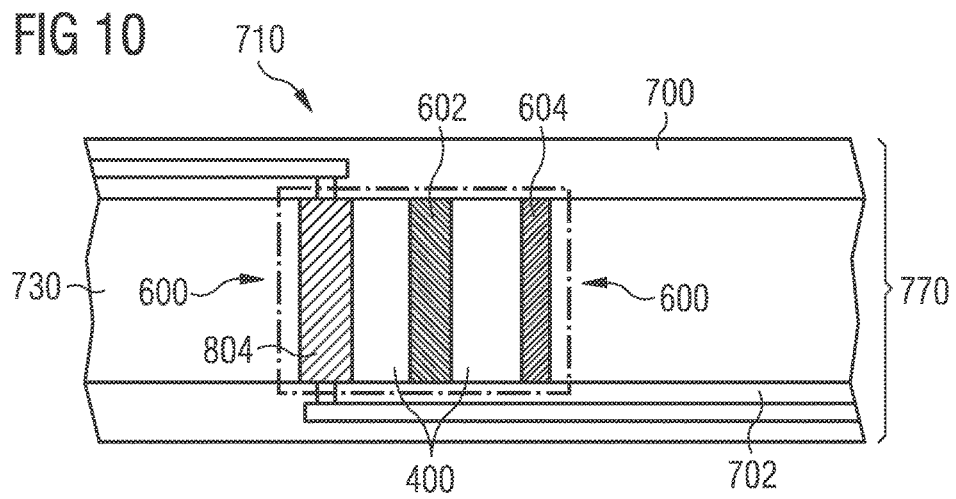

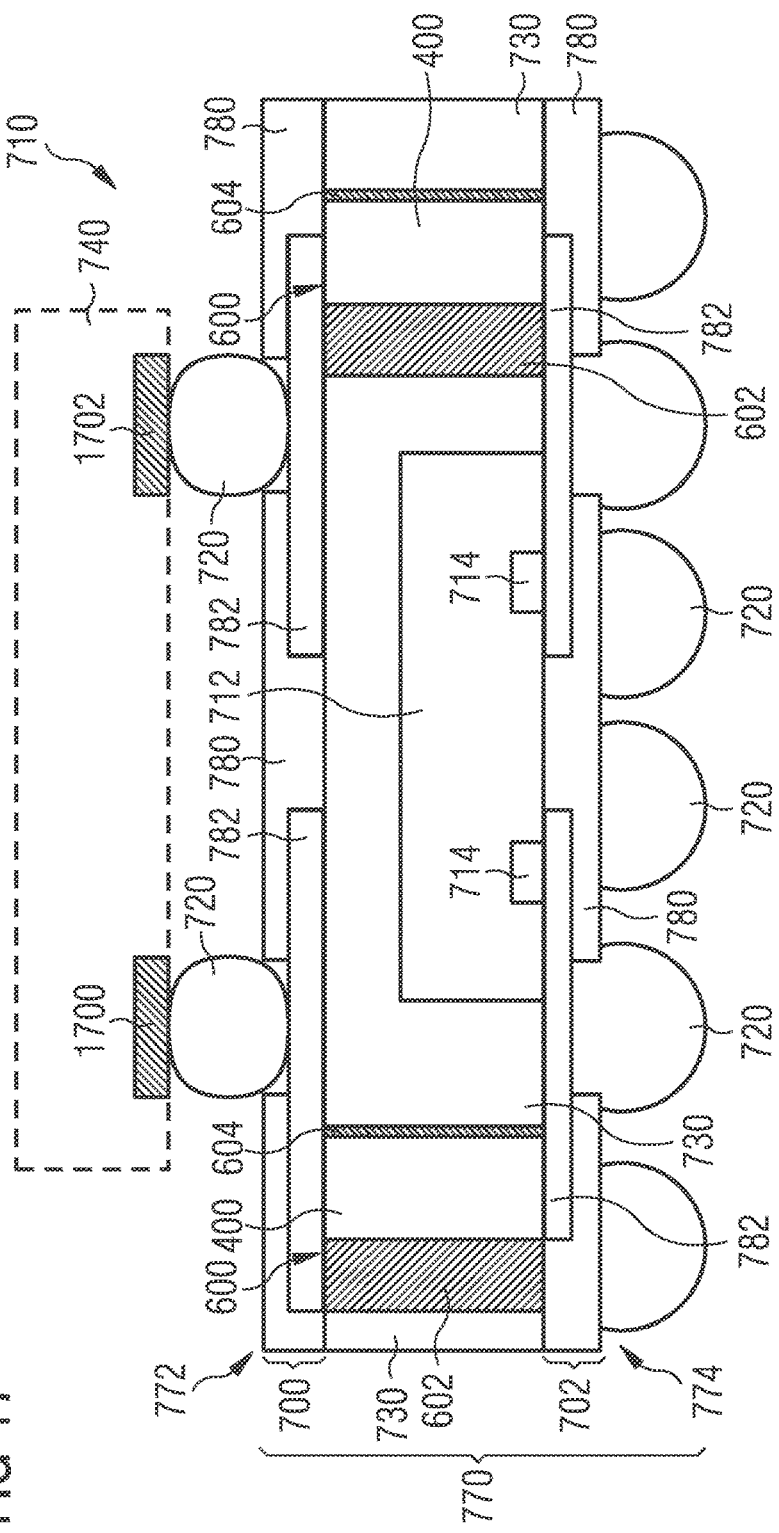

CONNECTOR BLOCK WITH TWO SORTS OF THROUGH CONNECTIONS, AND ELECTRONIC DEVICE COMPRISING A CONNECTOR BLOCK

BACKGROUND OF THE INVENTION

Field of the Invention

The present invention relates to connector blocks, methods of manufacturing connector blocks, an electronic device, and a method of manufacturing an electronic device.

Description of the Related Art

Packages may be denoted as encapsulated electronic chips with electrical connects extending out of the encapsulant and being mounted to an electron periphery, for instance on a printed circuit board.

U.S. Pat. No. 8,866,292 discloses a semiconductor package which includes a substrate having a first major surface and an opposite second major surface. A first chip disposed in the substrate. The first chip includes a plurality of contact pads at the first major surface. A via bar is disposed in the substrate.

SUMMARY THE INVENTION

There may be a need to provide a reliable and flexible possibility of establishing an electric interconnection.

According to an exemplary embodiment, a connector block (in particular for providing a vertical interconnection between opposing main surface regions of a semiconductor package) is provided which comprises an encapsulant, at least one first electrically conductive through connection (in particular a plurality of first electrically conductive through connections) extending through the encapsulant from a first surface of the encapsulant to a second (for instance an opposing second) surface of the encapsulant, and at least one second electrically conductive through connection (in particular a plurality of second electrically conductive through connections) extending along an exterior third surface of the encapsulant from the first surface of the encapsulant to the second surface of the encapsulant (wherein in particular a cross-sectional area of the one or more first electrically conductive through connections may be larger (for instance at least 20% larger, in particular at least 50% larger, more particularly at least 100% larger) than a cross sectional area of the one or more second electrically conductive through connections in a plane perpendicular to a direction extending from the first surface of the encapsulant to the second surface of the encapsulant).

According to another exemplary embodiment, a connector block (in particular for providing a vertical interconnection between (for instance opposing) main surface regions of a semiconductor package) is provided which comprises an encapsulant, a plurality of first electrically conductive through connections extending substantially parallel to one another through the encapsulant from a first surface of the encapsulant to a (for instance opposing) second surface of the encapsulant, and a plurality of second electrically conductive through connections extending substantially parallel to one another and substantially parallel to the plurality of first electrically conductive through connections (and in particular being exposed along an exterior third surface of the encapsulant) from the first surface of the encapsulant to the second surface of the encapsulant, wherein a cross-sectional area of the first electrically conductive through connections is different from a cross sectional area of the second electrically conductive through connections in a plane perpendicular to a direction extending from the first surface of the encapsulant to the second surface of the encapsulant.

According to yet another exemplary embodiment, a method of manufacturing a plurality (or batch) of connector blocks is provided, wherein the method comprises encapsulating at least part of a first preform of a plurality of first electrically conductive through connections by an encapsulant so that at least part of the preform of the first electrically conductive through connections extends through the encapsulant from a first surface of the encapsulant to a (for instance opposing) second surface of the encapsulant, subsequently forming a second preform of a plurality of second electrically conductive through connections extending at least partially along an exterior third surface of the encapsulant from the first surface of the encapsulant to the second surface of the encapsulant, separating the encapsulant with the first preform and the second preform to thereby form the plurality of connector blocks, so that each of the connector blocks comprises a portion of the encapsulant, a portion of the first preform as plurality of first electrically conductive through connections, and a portion of the second preform as plurality of second electrically conductive through connections.

According to yet another exemplary embodiment, a method of manufacturing a connector block is provided which comprises arranging a plurality of first electrically conductive through connections (or a preform thereof) on a temporary carrier, encapsulating the plurality of first electrically conductive through connections by an electrically insulating encapsulant so that the first electrically conductive through connections extend through the encapsulant from a first surface of the encapsulant to a (for instance opposing) second surface of the encapsulant and are exposed both at the first surface and the second surface, forming a plurality of second electrically conductive through connections extending along a third surface of the encapsulant from the first surface of the encapsulant to the second surface of the encapsulant, and removing the temporary carrier from the encapsulant and the through connections.

According to yet another exemplary embodiment, an electronic device is provided which comprises a semiconductor package having a first main surface region and a (for instance opposing) second main surface region and comprising a semiconductor chip comprising at least one chip pad in the second main surface region and a connector block (for instance a connector block having the above-mentioned features) comprising at least one first electrically conductive through connection and at least one second electrically conductive through connection extending with different cross-sectional areas between the first main surface region and the second main surface region and being arranged side-by-side with the semiconductor chip.

According to yet another exemplary embodiment, a method of manufacturing an electronic device with a semiconductor package having a first main surface region and a (for instance opposing) second main surface region is provided, wherein the method comprises providing a semiconductor chip comprising at least one chip pad in the second main surface region, and arranging a connector block side-by-side particular laterally juxtaposed between the first main surface region and the second main surface region) with the semiconductor chip, wherein the connector block comprises at least one first electrically conductive through connection and at least one second electrically conductive through connection extending with different cross-sectional areas between the first main surface region and the second main surface region.

According to an exemplary embodiment of the invention, a connector block is provided which can be used for fulfilling, for example in a package, an electric connection task for vertical signal propagation between two for instance opposing main surface regions of the package. For this purpose, two different kinds of electrically conductive through connections may be provided differing concerning the cross-sectional area the This has the advantage that for example an electrically conductive through connection having a larger cross-sectional area can be used for power connection tasks (and/or for ground connection tasks), whereas electrically conductive through connections with smaller cross-sectional area may be used for high-frequency or signal connection tasks. Thus, a simple and compact connector block may be provided which can be used as a multipurpose constituent of various electronic applications and allowing to support even sophisticated contacting requirements.

When the first and second electrically conductive through connections extend substantially in parallel to one another, low loss and short propagations paths between two main surface regions of a semiconductor package or the like are provided. The encapsulant may serve as an electrically insulating matrix, may provide mechanical support and may protect the electrically conductive through connections.

In particular, a connector block may be provided in which thick vias or vertical through connections may be applied prior to encapsulation, whereas thin vias or vertical through connections may be applied after encapsulation. This ensures a simple manufacturing process and provides a circuit designer with a high degree of freedom in terms of selecting the parameters of the formed connector block in accordance with a specific application.

Such a connector block may be implemented for providing vertical interconnects in many package architectures, in particular Fan-Out Wafer Level Package (e. g. eWLB (embedded Wafer Level Ball Grid Array)) packaging applications. In particular, it may be advantageously used for applications in which a packaged semiconductor chip is stacked with a further electronic component.

DESCRIPTION OF FURTHER EXEMPLARY EMBODIMENTS

In the following, further exemplary embodiments of the connector blocks, the electronic device, and the methods will be explained.

In the context of the present application, the term "semiconductor chip" may particularly denote a naked die, i.e. a non-packaged (for instance non-molded) chip made of a processed semiconductor, for instance a singulated piece of a semiconductor wafer. A semiconductor chip may however also e an already packaged (for instance molded) die. One or more integrated circuit elements (such as a diode, a transistor, etc.) may be formed within the semiconductor chip. Such a semiconductor chip may be equipped with a metallization, in particular with one or more pads.

In the context of the present application, the term "pad" may particularly denote an electrically conductive contact or to formed on a surface of the semiconductor chip which allows to electrically contact the one or more integrated circuit elements of the semiconductor chip. For example, a supply signal, a control signal or a data signal may be conducted from an electronic periphery into an interior of the package and into the semiconductor chip via the one or more pads. In a similar way, a supply signal, a control signal or a data signal may be conducted from the semiconductor chip to the electronic periphery via the one or more pads. The pads may be embodied as metallic islands on the chip.

In an embodiment, the connections are completely embedded (as horizontal traces) first. After separation, where the electrically conductive through connections are exposed, and a tilt by 90°, the connection in a z-direction may be made. In such an embodiment, the connection is not yet structured at the beginning of the process.

In an embodiment, the first electrically conductive through connections are configured as at least a portion of at least one of the group consisting of a leadframe, a copper structure, a circumferential frame with a plurality of parallel webs, and a patterned electrically conductive sheet. Correspondingly, the first preform may be configured as at least one of the group consisting of a leadframe, a circumferential frame with a plurality of parallel webs, and a patterned electrically conductive sheet. The effort for manufacturing the first electrically conductive through connections may be kept very small when multiple of them are formed on the basis of a continuous structure such as a leadframe. It is then sufficient for the manufacturing procedure that such a continuous structure is, as a whole, encapsulated by an encapsulant, for instance by molding, printing or lamination. Subsequently, the at least partially encapsulated continuous structure may be divided into a plurality of connector blocks by sawing, etching, stamping or laser cutting. This simplifies handling of the various first electrically conductive through connections during the manufacturing procedure.

In an embodiment, the second electrically conductive through connections are configured as at least one of the group consisting of electroplated structures and sputtered structures. Correspondingly, the second preform may be formed by at least one of the group consisting of sputtering or electro-less plating and electroplating or printing or ink jetting electrically conductive material on the third surface of the encapsulant. Therefore, in contrast to the first electrically conductive through connections, the second electrically conductive through connections may be formed by an additive process which allows to manufacture them with a thin and precisely controllable cross-sectional area and therefore appropriate for high-frequency and signal transmission applications. Such a material deposition procedure for forming the second electrically conductive contact structures is highly compatible with manufacturing plural connector blocks in a batch procedure, i.e. at the same time, and therefore highly efficiently.

In an embodiment, the encapsulant comprises a laminate, in particular a printed circuit board laminate. In the context of the present application, the term "laminate structure" may particularly denote an integral flat member formed by electrically conductive structures and/or electrically insulating structures which may be connected to one another by applying a pressing force. The connection by pressing may be optionally accompanied by the supply of thermal energy. Lamination may hence be denoted as the technique of manufacturing a composite material in multiple layers. A laminate can be permanently assembled by heat and/or pressure and/or welding and/or adhesives.

In another embodiment, the encapsulant comprises a mold, in particular a plastic mold. For instance, a correspondingly encapsulated set of electrically conductive through connections may be provided by placing the corresponding preform(s) between an upper mold die and a lower mold die and to inject liquid mold material therein. After solidification of the mold material, the formation of the encapsulant with the preform(s) in between is completed.

In an embodiment, the connector block is configured as a bar (which may be denoted as via bar) in which the first electrically conductive through connections and/or the second electrically conductive through connections are arranged sequentially and spaced along a linear direction. Such a bar may be a substantially cuboid structure having a significantly larger extension in one direction than in the other two directions. For instance, the extension in the long direction may be at least twice, in particular at least three times, of the extension in any of the other two orthogonal directions. Along the longest extension direction of such a bar, the various first and second electrically conductive through connections may be arranged in parallel to one another and side-by-side. Such an architecture allows to easily implement the bar type connector block into different kinds of electronic applications with very short propagation paths. The number of electric connections may be simply scaled by the length of the bar along the longest direction. It should however be said that other geometries than a bar or rod architecture are possible, for instance a disc-shaped configuration with a circular circumference. The distances between the electric connections may be regular or may be distributed in and/or on the bar with different distances. Irregular distances between the vias may be helpful for routing of the package.

In an embodiment, the cross-sectional area of each of the first electrically conductive through connections is in a range between 100 $\mu m^2$ and 1 $mm^2$, in particular in a range between 400 $\mu m^2$ and $10^4$ $\mu m^2$. Such dimensions are in accordance with requirements of high power applications. In contrast to this, the cross-sectional area of each of the second electrically conductive contact structures may be at least a factor of 3, in particular at least a factor of 5, more particularly at least a factor of 10 smaller than the cross-sectional area of the first electrically conductive through connections.

In an embodiment, the method comprises arranging the plurality of first electrically conductive through connections on the temporary carrier with an adhesive, in particular a double sided adhesive, in between. The concept of manufacturing one or advantageously a plurality of connector blocks at the same time may be rendered even more reliable when the preform of the first electrically conductive through connections (for instance a leadframe) is adhered on such a temporary carrier prior to the encapsulation procedure. The carrier may then not only mechanically support the constituents of the connector blocks to be manufactured, but may also spatially fix the preform relative to the encapsulant. The result of the use of a temporary carrier with adhesive thereon is a set of manufactured connector blocks with homogeneous properties with reliable and reproducible electric and mechanical performance. The temporary carrier, as well as the adhesive material, may be removed later so as to not form part of the final connector block. Arranging a double-sided adhesive (such as a double-sided tape) between the temporary carrier and the connector blocks to be manufactured increases the adhesion of the semifinished connector block(s) during manufacture. Undesired release of the semifinished product of the connector block(s) from the temporary carrier prior to the completion of the manufacturing process can therefore be safely prevented. A separation or singularization procedure for the individual connector blocks can be carried out prior or after removing them from the adhesive tape. Removal of the connector block(s) or a preform thereof from the adhesive tape may be accomplished by the use of a thermally releasable adhesive tape which may be configured to remain adhesive only until the temperature is increased above a threshold value which triggers loss or weakening of the adhesive character of the previously adhesive tape, in general the separation is achieved by the addition of energy, which may be thermal, chemical or any other form of energy.

In an embodiment, the first electrically conductive through connections are configured for power transmission during operation of the electronic device. For power transmission, for instance in automotive applications, high current has to be transported. This is possible in a particularly appropriate way via the first electrically conductive through connections when they have a higher cross-sectional area than the second electrically conductive through connections.

In an embodiment, the second electrically conductive through connections are configured for signal transmission, in particular for a high-frequency signal transmission, during operation of the electronic device. For signal transmission purposes, in particular when high-frequency signals are involved, a small cross-sectional area of the second electrically conductive through connections is advantageous in terms of functionality and compactness.

In an embodiment, the electronic device further comprises an electronic component arranged on or above the first main surface region of the semiconductor package and comprising a first electric contact electrically coupled with the at least one first electrically conductive through connection and a second electric contact electrically coupled with the at least one second electrically conductive through connection. The electronic component may be surface mounted on the package formed by the semiconductor chip and the at least one connector block (which may be encapsulated by a package encapsulant).

In an embodiment, the electronic component is configured as at least one of the group consisting of a further semiconductor chip, an antenna, a passive electronic member, an active electronic member, and an electromagnetic radiation shielding structure.

In an embodiment, the electronic device—in particular the semiconductor package thereof—further comprises a first electrically conductive redistribution layer arranged in the first main surface region and electrically coupled with the at least one first electrically conductive through connection and the at least one second electrically conductive through connection. The first electrically conductive redistribution layer may be additionally electrically coupled with the first contact and the second contact of the electronic component, if present. In an embodiment, the electronic device—in particular the semiconductor package thereof—further comprises a second electrically conductive redistribution layer arranged in the second main surface region and electrically coupled with the at least one chip pad, the at least one first electrically conductive through connection and the at least one second electrically conductive through connection. The two at least partially electrically conductive redistribution layers sandwiching the semiconductor chip may be electrically connected to one another in a vertical direction via the one or more connector blocks. It is also possible that any or the described redistribution layers is configured as an arrangement (for instance a laminate) of at least one patterned electrically conductive layer and at least one patterned electrically insulating layer (see for instance FIG. 17).

In an embodiment, the electronic device comprises one or more solder structures on at least one of the first electrically conductive redistribution layer and the second electrically conductive redistribution layer. Providing one or more solder structures on one or both of the redistribution layers allows to simplify subsequent mounting of the electronic device on a mounting base or electronic periphery device such as a printed circuit board. Also mounting of a further electronic component on the semiconductor package may be possible via one or more solder structures.

In an embodiment, the electronic device comprises a further encapsulant (i.e. another encapsulant in addition to the encapsulant of the connector block(s) of the electronic device), which may be denoted as package encapsulant and in which the semiconductor chip may be encapsulated together with the connector block. The at least one semiconductor chip and one or more of the connector blocks may be arranged side-by-side to one another between the two redistribution layers, wherein remaining gaps may be filled by package encapsulant. The package encapsulant can be a further mold compound or a further laminate.

In an embodiment, the electronic device comprises at least one further semiconductor chip (as electronic component) electrically coupled with the semiconductor chip via the connector block and/or solder structures and/or at least one of the redistribution layers. In an embodiment, the at least one further semiconductor chip is configured as at least one of the group consisting of a further semiconductor chip arranged side-by-side with the semiconductor chip, and a further semiconductor chip being surface mounted on at least one of the first redistribution layer and the second redistribution layer, if desired via solder structures. Thus, applications with multiple semiconductor chips are possible. For instance, multiple semiconductor chips may be arranged within one and the same electronic device. Alternatively, two electronic devices may be connected to one another, each being equipped with at least one semiconductor chip.

In an embodiment, the semiconductor chip is a power semiconductor chip. Such a power semiconductor chip may have integrated therein one or multiple integrated circuit elements such as transistors (for instance field effect transistors like metal oxide semiconductor field effect transistors and/or bipolar transistors such as insulated gate bipolar transistors) and/or diodes. Exemplary applications which can be provided by such integrated circuit elements are switching purposes. For example, such another integrated circuit element of a power semiconductor device may be integrated in a half-bridge or a full bridge. Exemplary applications are automotive applications.

In an embodiment, the electronic device is configured as a fan-out Wafer Level Package (e. g. embedded Wafer Level Ball Grid Array package (eWLB)). This may involve the use of an artificial wafer formed of multiple separate semiconductor chips and an encapsulant.

The one or more semiconductor chips may comprise at least one of the group consisting of a diode, and a transistor, more particularly an insulated gate bipolar transistor. In an embodiment, the electronic device is configured as a power module. For instance, the one or more electronic chips may be used as semiconductor chips for power applications for instance in the automotive field. In an embodiment, at least one semiconductor chip may comprise a logic IC or a semiconductor chip for RF power applications. In one embodiment, the semiconductor chip(s) may be used as one or more sensors or actuators in microelectromechanical systems (MEMS), for example as pressure sensors or acceleration sensors.

As substrate or wafer for the semiconductor chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings:

FIG. 1 to FIG. 5 show different views of structures obtained during carrying out a method of manufacturing a connector block according to an exemplary embodiment of the invention.

FIG. 8 to FIG. 10 show different views of structures obtained during carrying out a method of manufacturing a connector block and an electronic device comprising such a connector block according to another exemplary embodiment of the invention.

FIG. 17 shows a cross-sectional view of an electronic device according to an exemplary embodiment of the invention manufactured according to FIG. 11 to FIG. 16.

DETAILED DESCRIPTION OF EXEMPLARY EMBODIMENTS

Figure 4:
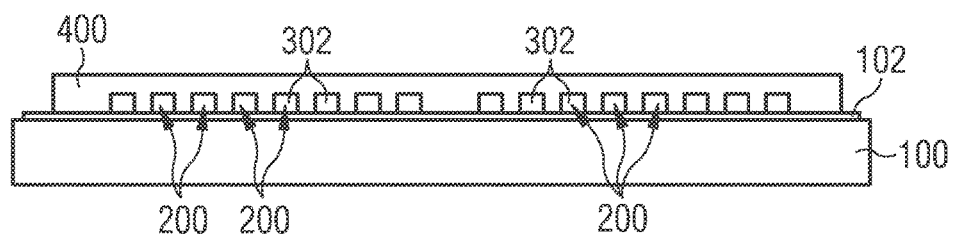

The illustration in the drawing is schematically and not to scale.

Before exemplary embodiments will be described in more detail referring to the figures, some general considerations will be summarized based on which exemplary embodiments have been developed.

According to an exemplary embodiment, a connector block configured as preplaced through encapsulant vias (TEV) for power connections and signals is provided.

SiP (System in Package) integration is a major field of development in the packaging arena. Integration solutions often include stacking capabilities in z-direction. Fan-Out Wafer Level Packages (for example eWLB) offer low cost, high performance stacking capabilities, especially, if the vias, which are required to connect in z-direction are prefabricated and are embedded similar to the dies in the package. This allows to use known-good-via (KGV), because the vias can be tested in advance of the use.

According to an exemplary embodiment of the invention, a connector block configured as a via bar comprises encapsulated first through connections as thicker vias and plated second through connections as thinner vias on an exterior surface of the encapsulant. Such connector blocks may be embedded aside a plurality of semiconductor chips or dies in eWLB technology. This allows connection in z-direction for signal connections via second through connections, and for power/ground connection via the first through connections, with high currents. This architecture makes it possible to provide thick diameter vias together with thinner vias, in order to allow power connections with a high current carrying capability as well.

An exemplary embodiment of the invention uses a thick copper leadframe or structured copper sheet (can be made of another material as well, especially materials which cannot be applied in electroplating manner) as a first preform for first electrically conductive through connections, which may be embedded prior to molding. This metal sheet can be thick and of any material or material compound/stack. After embedding of the first preform, additional tiny vias may be applied as a second preform for second electrically conductive through connections. An obtained via bar may be separated into a plurality of connector blocks. A respective one of these connector blocks may then be tilted and oriented in an appropriate way so as to be embedded together with one or more semiconductor chips in a package encapsulant so as to obtain a package or electronic device according to an exemplary embodiment of the invention.

Such via bars contain thick diameter vias (or special material via bars) in form of the first through connections for excellent current carrying capability and small vias in form of the second through connections for excellent high frequency performance. The use of a leadframe, a thick structured metal and/or conductive sheets as preform for the first through connections together with sputtered and/or electroplated second through connections allows to provide a connection in z-direction with multiple via diameters in one via bar or connector block.

For manufacture of such a connector block (see also FIG. 1 to FIG. 5), a mold carrier (for example a mold carrier configured for eWLB technology), which can also be denoted as temporary carrier, may be used as starting point of the process flow. Such a temporary carrier can be made of a metal, a polymer or a ceramic plate. An adhesive or a double sided adhesive tape or foil may be attached to the plate-shaped temporary carrier. A pre-structured conductive sheet, which can be a lead-frame material (for example a copper lead-frame), any other metal or a stack of metals or a compound can be attached to the mold carrier as first preform for the first through connections. In principle, the sheet can also be unstructured, it can be a conductive polymer or even the sheet may be applied in a printing, dispensing or similar process to the temporary carrier. If a structured metal sheet is used, the structured sheet can be structured by an etching or a laser treatment, either prior to the attachment to the sheet or after embedding in the encapsulant, such as a mold compound. The thickness of the conductive sheet used as first preform for the first through connections can be chosen freely, for instance in a range between 20 µm and 200 µm, depending on the desired current carrying capability.

Subsequently, the copper sheet may be embedded in the encapsulant (for instance a mold compound, a polymer or a laminate). The format at the reconstituted substrate can be round or rectangular/square. The embedding compound or encapsulant may be made of an electrically insulating material having the desired dielectric strength to serve for the required current carrying capability. The embedding compound or encapsulant can be applied in a molding procedure (for example compression molding), by lamination, or by printing.

After embedding of the conductive sheet, i.e. after having encapsulated the first preform of the first through connections, an optional grinding procedure may be carried out, to reduce the thickness of the bar and/or to provide a smooth surface. Next, redistribution lines may be applied as a second preform of the second through connections. This can be done by printing, thin-film technology or PCB-like processes. Different processes like sputtering, electroplating, etching or other can be used. The thickness of the line forming the second through connections may be below 30 µm, in particular below 20 µm, more particularly below 10 µm.

After this, the obtained reconstituted substrate may be separated (for instance by dicing), to thereby obtain a plurality of connector blocks. These connector blocks (which may be also denoted as via blocks) may be tilted by 90° and can now be used for being embedded in another Fan-Out WLB (for instance eWLB). The two different via diameters (related to the first through connections and the second through connections, respectively) are looking different in the connector block: the thick ones are completely embedded in the encapsulant, whereas the thinner ones are attached on top of the encapsulant.

One important advantage of the described connector blocks is that big, large diameter via bars (in form of the first through connections) and small, high-performance-at-high-frequency vias (in form of the second through connections) can be realized in one via or connector bar at lowest cost and effort.

The mold compound, constituting one embodiment of the encapsulant, can also be replaced by a laminate. In a corresponding manufacturing method (see also FIG. 8 to FIG. 10), the connector blocks may be configured as pieces of laminate with thick bottom metallization (for instance as a base) and thin top metallization. After singularization (for instance by dicing) and rotation by 90°, it is possible to obtain basically the same functionality as using mold-based connector blocks. Advanced laminate technology offers metal pattern resolution of about 10 µm to 20 µm. By using a laminate for the encapsulant, cost and effort can be further reduced and flexibility can be further increased (for instance it is possible to provide a significant number of layers). The combination of horizontal redistribution layers of eWLB and sandwiched thin and thick layers in laminate for vertical interconnections may be specifically advantageous for certain applications (for example 3C passives, 3D antennas, etc.).

FIG. 1 to FIG. 5 show different views of structures obtained during carrying out a method of manufacturing a connector block 600 (shown in FIG. 6) according to an exemplary embodiment of the invention.

In order to obtain a structure shown in the cross-sectional view of FIG. 1, a temporary carrier 100 is covered with an optional double sided adhesive 102. The double sided adhesive 102 may be a foil which may be thermally releasable, i.e. loses (or at least significantly reduces) its adhesive properties when being heated above a certain threshold temperature of for example 170° C. The temporary carrier 100 shown in FIG. 1 can be a mold carrier (such as a mold carrier used for eWLB applications). The double sided adhesive 102 may be applied to improve adhesion of subsequently mounted constituents of the connector block 600 to be manufactured on the temporary carrier 100.

In order to obtain a structure shown in the cross-sectional view of FIG. 2, a leadframe—as a preform 200 for a plurality of first electrically conductive through connections 602 (see FIG. 6) of the connector block 600 to be manufactured—is arranged on the double sided adhesive 102 on the temporary carrier 100. FIG. 3 is a plan view of an example for the first preform 200 being configured as a plurality of parallel webs 302 connected to one another by a circumferential frame 304. In the readily manufactured connector block 600, each of the first through connections 602 will be embodied as a portion of one of the webs 302. The circumferential frame 304 does not form part of the readily manufactured connector block 600.

As can be taken from the cross-sectional view of FIG. 2, the first preform 200, shaped as a structured electrically conductive sheet, may be attached to the double sided adhesive 102 on the temporary carrier 100 as preform of the first electrically conductive through connections 602 to be formed. The preform 200 of the first electrically conductive through connections 602 may also look similar as a comb structure. It may be made of a metallic material (for instance of copper). The thickness of this preform 200 may for example be in a range between 25 μm and 100 μm or even thicker. For example, several standard thicknesses of 25 μm, 50 μm and 100 μm may be defined.

In order to obtain a structure shown in the cross-sectional view of FIG. 4, the first preform 200 is encapsulated in an encapsulant 400 such as a mold compound formed for instance by compression molding. After curing, the encapsulant 400 becomes solid.

Figure 5:
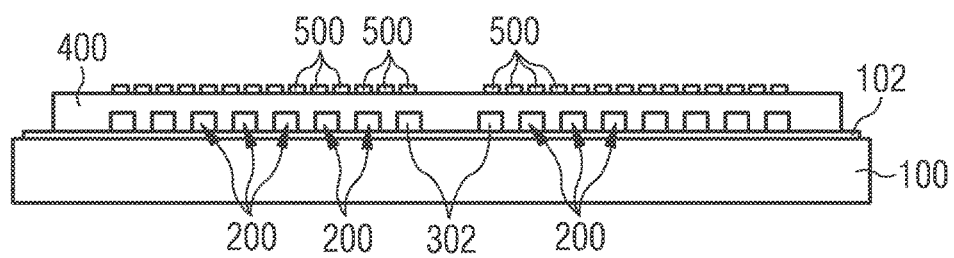

In order to obtain a structure shown in FIG. 5, a second preform 500 of a plurality of second electrically conductive through connections 604 (see FIG. 6) is formed on an exterior surface of the encapsulant 400. The second preform 500 can be formed by sputtering, electro-less plating and/or electroplating of electrically conductive material such as copper on an exposed upper surface of the encapsulant 400. The second preform 500 may be an arrangement of parallel aligned stripes. In the architecture shown in FIG. 4, corresponding electrically conductive material is attached on the top side of the molded substrate (for instance panel or wafer).

Next, the body formed by the first preform 200, the encapsulant 400 embedding the first preform 200 and the second preform 500 on an exterior surface of the encapsulant 400 are removed as a whole from the temporary carrier 100. When the double sided adhesive 102 is thermally releasable, this removal can be performed by heating the double sided adhesive 102 above a temperature (for instance 170° C.) at which the double sided adhesive 102 experiences a significant reduction of is adhesive character. Then, the body may be simply taken off the double sided adhesive 102 and will therefore be separated from the temporary carrier 100.

Figure 6:
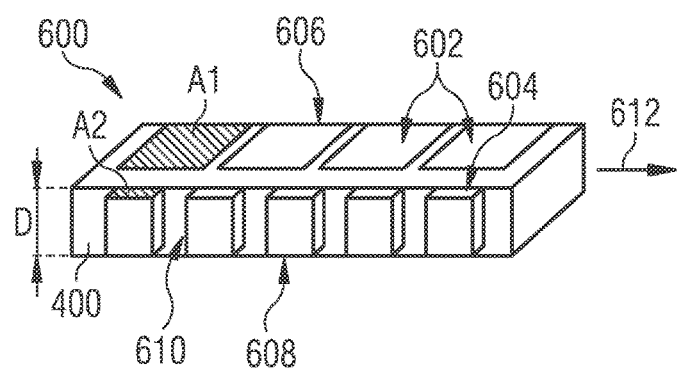
FIG. 6 shows a three-dimensional view of a connector block according to an exemplary embodiment of the invention manufactured in accordance with FIG. 1 to FIG. 5.

Next, the separated body of the encapsulant 400 with the encapsulated first preform 200 and the formed second preform 500 is singularized into a plurality of bar shaped body to thereby form the plurality of connector blocks 600, as shown in FIG. 6. Each of the connector blocks 600 comprises a portion of the encapsulant 400, a portion of the first preform 200 as the plurality of first electrically conductive through connections 602, and a portion of the second preform 500 as the plurality of second electrically conductive through connections 604.

FIG. 6 shows a three-dimensional view of such a connector block 600 according to an exemplary embodiment of the invention manufactured in accordance with FIG. 1 to FIG. 5.

The plurality of first electrically conductive through connections 602 of the connector block 600 extend through the encapsulant 400 from a (here upper) first surface 606 of the encapsulant 400 to an opposing (here lower) second surface 608 of the encapsulant 400. Correspondingly, the plurality of second electrically conductive through connections 604 extending along an exterior (here vertical) third surface 610 of the encapsulant 400 from the first surface 606 of the encapsulant 400 to the second surface 608 of the encapsulant 400. As can be taken from FIG. 6, a cross-sectional area A1 (for instance $10^4$ μm$^2$) of the first electrically conductive through connections 602 is larger than a cross sectional area A2 (for instance 10% of A1) of the second electrically conductive through connections 604 in a plane perpendicular to a direction extending from the first surface 606 of the encapsulant 400 to the second surface 608 of the encapsulant 400. Over the entire distance D (for instance in a range between 20 μm and 500 μm) from the first surface 606 to the second surface 608, shape and area of a cross-section of the first electrically conductive through connections 602 may be constant (which is however only an option). Correspondingly, shape and area of a cross-section of the second electrically conductive through connections 604 are constant over the entire distance D from the first surface 606 to the second surface 608. Each of the plurality of first electrically conductive through connections 602 extend parallel to one another and parallel to the plurality of second electrically conductive through connections 604.

As shown in FIG. 6, the connector block 600 is configured as a via bar with large dimensioned first electrically conductive through connections 602 and smaller dimensioned second electrically conductive through connections 604. The through connections 602, 604 are all arranged or aligned sequentially along a linear direction 612. In the shown embodiment, the first electrically conductive through connections 602 are arranged equidistantly. Moreover, the second electrically conductive through connections 602 are arranged equidistantly. However, the number of first electrically conductive through connections 602 may be different from (in the shown embodiment smaller than) the number of second electrically conductive through connections 604 in the connector block 600.

Figure 7:
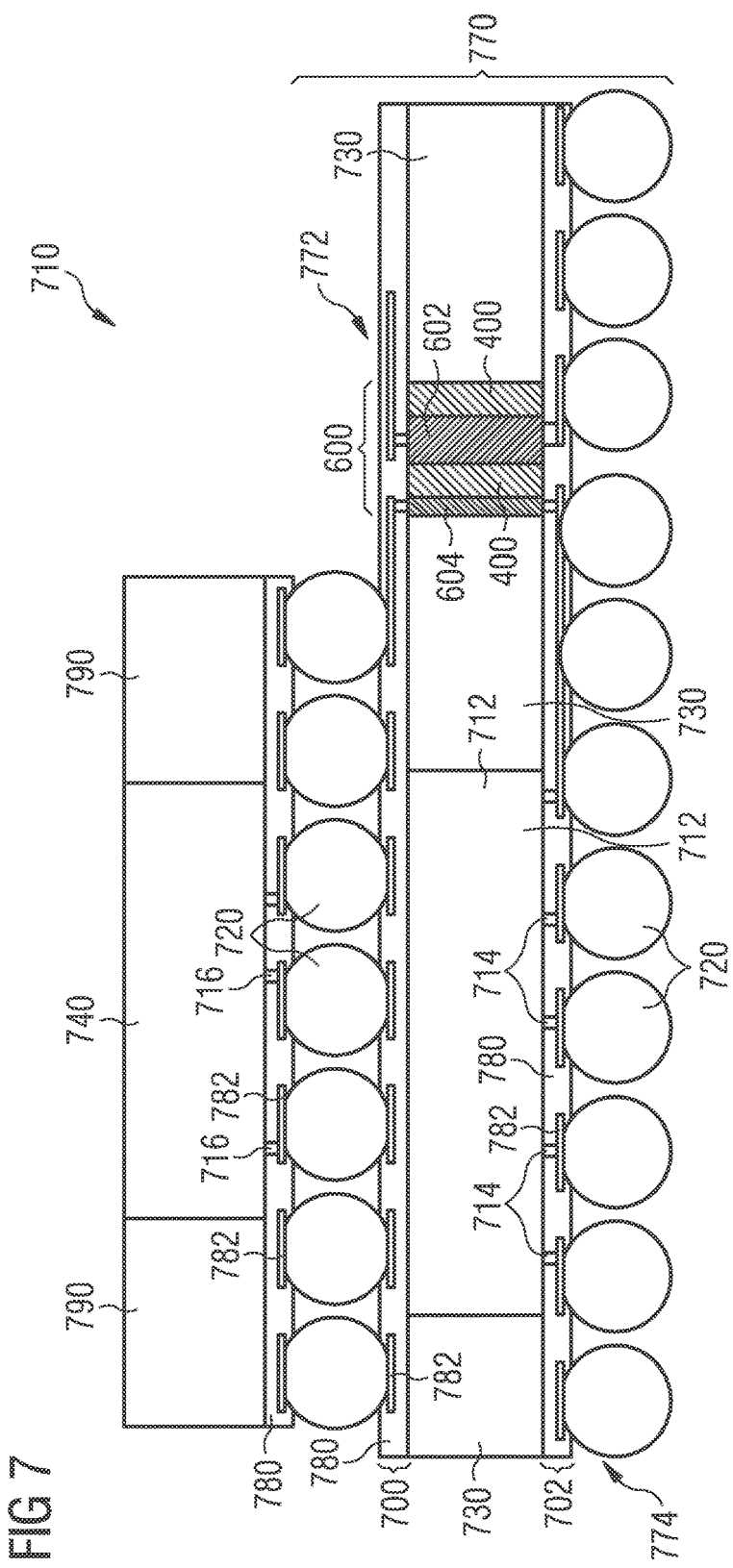
FIG. 7 shows a cross-sectional view of an electronic device according to an exemplary embodiment of the invention.

After separation (for instance dicing) and tilting by 90°, the connector bar or connector block 600 can be embedded in a fan out WLB (e. g. eWLB) for connection in z-direction with multiple via purpose (see also FIG. 7 and FIG. 17). The first electrically conductive through connections 602 form large embedded vias which are highly appropriate for power transmission and ground connection. Consequently, high performance in terms of current carrying capability and electromigration may be obtained with them. The second electrically conductive through connections 604, however, are small vias which are applied after the molding and which are highly appropriate for signal transmission, in particular with a high performance in high-frequency applications.

FIG. 7 shows a cross-sectional view of an electronic device 710 according to an exemplary embodiment of the invention.

The electronic device 710 comprises a semiconductor package 770 having a first main surface region 772 and an opposing second main surface region 774 and comprising a semiconductor chip 712. The semiconductor chip 712 comprises, in turn, chip pads 714 in the second main surface region 774. A first electrically conductive redistribution layer 700 of the semiconductor package 770 is arranged in the first main surface region 772. The first electrically conductive redistribution layer 700 is composed of an electrically insulating layer structure 780 and of an electrically conductive layer structure 782. A second electrically conductive redistribution layer 702 of the semiconductor package 770 is arranged in the second main surface region 774 and is electrically coupled with chip pads 714 on the bottom side of the semiconductor chip 712.

A connector block 600, as illustrated in FIG. 6, is configured for providing a vertical interconnection between the electrically conductive layer structures 782 in the opposing main surface regions 772, 774 of the semiconductor package 770. The connector block 600 is arranged side-by-side or laterally next to one another with the semiconductor chip 712 and vertically between and electrically coupled with the first electrically conductive redistribution layer 700 and the second electrically conductive redistribution layer 702. The first electrically conductive through connections 602 of the connector block 600 are configured for power transmission during operation of the electronic device 710. In contrast to this, the second electrically conductive through connections 604 are configured for high-frequency signal transmission, during operation of the electronic device 710.

A further, so-called package encapsulant 730 (for instance a mold compound) is provided in which the semiconductor chip 712 and the connector block 600 are encapsulated together within the semiconductor package 770.

Solder structures 720, here configured as solder balls, can be provided on the first electrically conductive redistribution layer 700 and on the second electrically conductive redistribution layer 702 and are directly connected to the corresponding electrically conductive layer structures 782.

Moreover, the electronic device 710 comprises a further semiconductor chip (with further chip pads 716, and being embedded in yet another encapsulant 790) as additional electronic component 740 which mounted on top of the semiconductor package 770 and is electrically coupled with the semiconductor chip 712 via solder structures 720 and the connector block 600. For example, the semiconductor chi 712 may be a logic chip, and the electronic component 740 may be a memory chip.

In the configuration according to FIG. 7, the connector block 600 is embedded in one of the packages (i.e. semiconductor package 770 and encapsulated further semiconductor chip 740) of the electronic device 710 to be connected to one another. The two packages are mounted on top of one another. However, other applications are possible as well. In the shown embodiment, the connector block 600 is a prefabricated brick of mold compound (see encapsulant 400) with embedded and surface formed through connections 602, 604 and is turned by 90° as compared to FIG. 6 with interconnections realized using thin-film redistribution layers in eWLB architecture.

FIG. 8 and FIG. 9 show different views of structures obtained during carrying out a method of manufacturing a connector block 600 according to another exemplary embodiment of the invention. FIG. 10 show the connector block 600 integrated in an electronic device 710 according to an exemplary embodiment of the invention.

In FIG. 8, a single first electrically conductive through connection 602 is shown embedded in laminate material of the encapsulant 400. In the shown embodiment, the encapsulant 400 is formed by two electrically insulating layers 802, 804 (for instance both made of prepreg material, i.e. glass fibers it a resin matrix). Additionally, in this example, three second electrically conductive through connections 604 are formed on an external surface of the encapsulant 400, again manufactured by electroplating. FIG. 8 shows also a third electrically conductive through connection 800 which can be for instance 100 µm thick. A thickness of the first electrically conductive through connection 602 may be also 100 µm. In contrast to this, a thickness of the second electrically conductive contact structures 604 can be much smaller, for instance 10 µm. The elements of FIG. 8 can be connected to one another by applying pressure, if desired supported by heat.

While FIG. 8 shows a cross-sectional view of the connector block 600 in laminate technology, FIG. 9 shows a three-dimensional view and also illustrates that the bar shaped connector block 600 according to FIG. 8 to FIG. 10 can have a vertical dimension, H, in the order of magnitude between 100 µm and 500 µm. More generally, the thickness in connection direction may be in a range between 50 µm and 1 mm. It is hence very compact in the vertical direction and nevertheless allows sophisticated electrical connection tasks with low loss of energy and signal content in view of the short propagation paths. Reference numeral 810 shows dicing lines along which a preform of multiple connector blocks 600 can be diced for singularization. The arrangement shown in FIG. 9 is obtained by rotating the arrangement of FIG. 8 by 90°.

As can be taken from FIG. 10, the connector block 600 may be integrated in an electronic device 710 with eWLB redistribution layers 700, 702 as well as a package encapsulant 730 such as a mold eWLB. The embedded connector block 600 then serve for conducting electric signals and power between the redistribution layers 700, 702. The architecture according to FIG. 8 to FIG. 10 corresponds to a multilayer laminate with vertical interconnections of mixed width/spacing/thickness.

FIG. 11 to FIG. 16 show different views of structures obtained during carrying out a method of manufacturing an electronic device 710 according to an exemplary embodiment of the invention.

Figure 11:
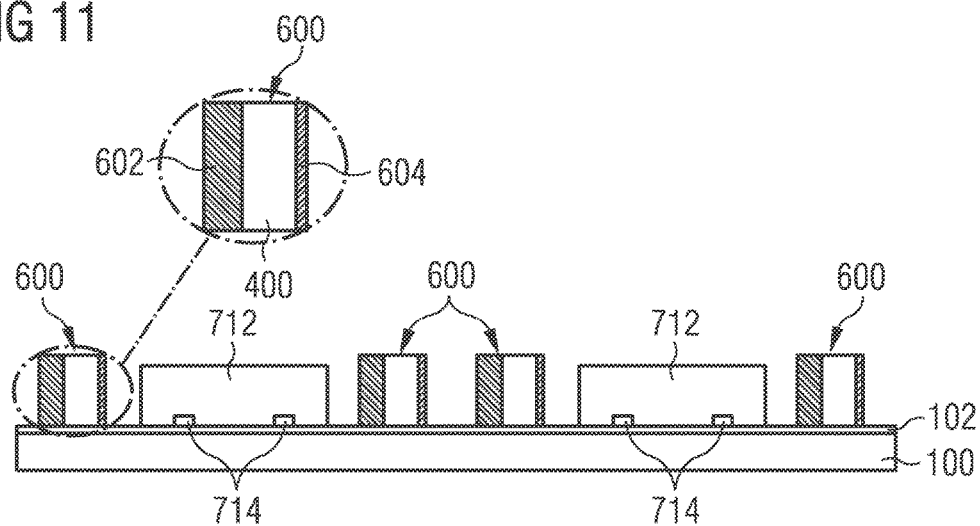
FIG. 11 to FIG. 16 show different views of structures obtained during carrying out a method of manufacturing an electronic device according to an exemplary embodiment of the invention.

In order to obtain a structure shown in FIG. 11, a plurality of semiconductor chips 712 and a plurality of connector blocks 600 as shown in FIG. 6 are picked and placed side-by-side and laterally spaced from one another on a temporary carrier 100 on which a double sided adhesive 102 is formed.

Figure 12:
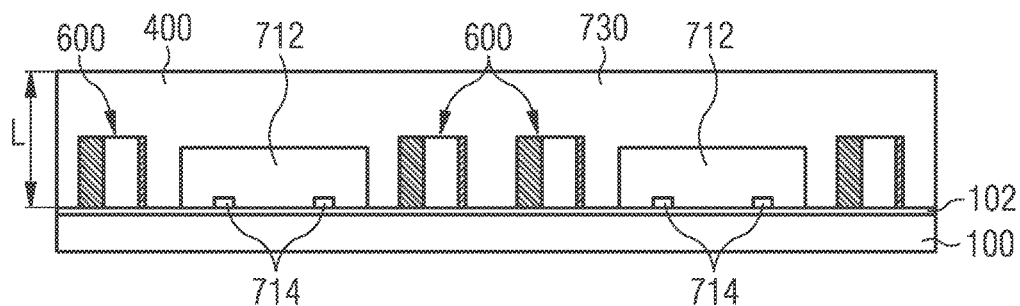

In order to obtain a structure shown in FIG. 12, a package encapsulant 730 is formed by compression molding, for instance with a mold thickness, L, of 800 µm. After compression molding and curing, a self-carrying or self-supporting structure is obtained so that the temporary carrier 100 can be removed. This can be accomplished by temporarily increasing the temperature above a certain value of for example 170° C., at which temperature the adhesive foil in form of the double sided adhesive 102 loses its strongly adhesive property (for instance since alcohol in the adhesive foil evaporates at these temperatures).

Figure 13:
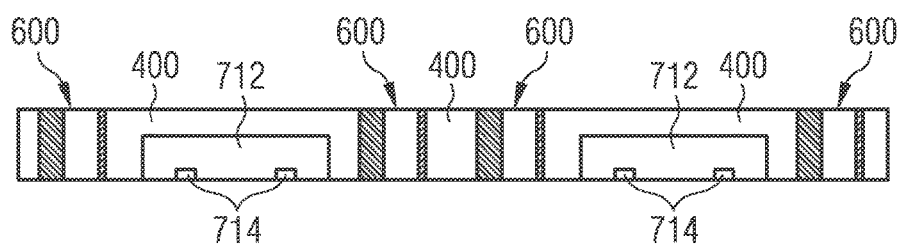

In order to obtain a structure shown in FIG. 13, the structure shown in FIG. 12 is vertically thinned by backside grinding. This increases compactness and exposes the electrically conductive end faces of the connector blocks 600. Grinding can be carried out before or after release of the body from the double sided adhesive 102 on the temporary carrier 100.

Figure 14:
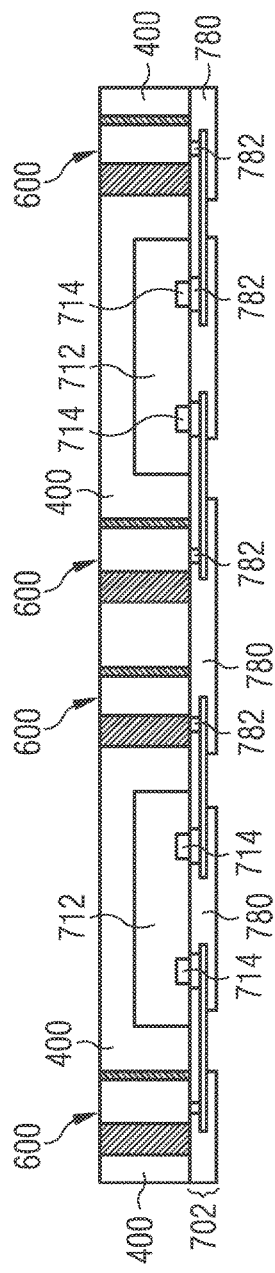

In order to obtain a structure shown in FIG. 14, a redistribution layer 702 is formed on the lower main surface of the structure shown in FIG. 13.

Figure 15:
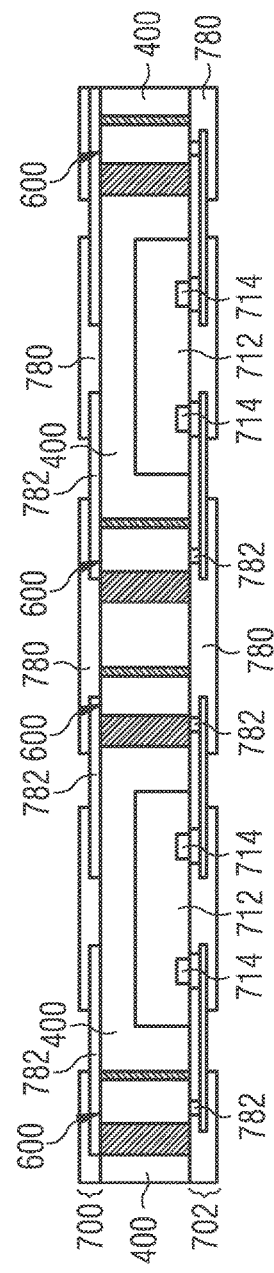

In order to obtain a structure shown in FIG. 15, another redistribution layer 700 is formed on the upper main surface of the structure shown in FIG. 14.

Figure 16:
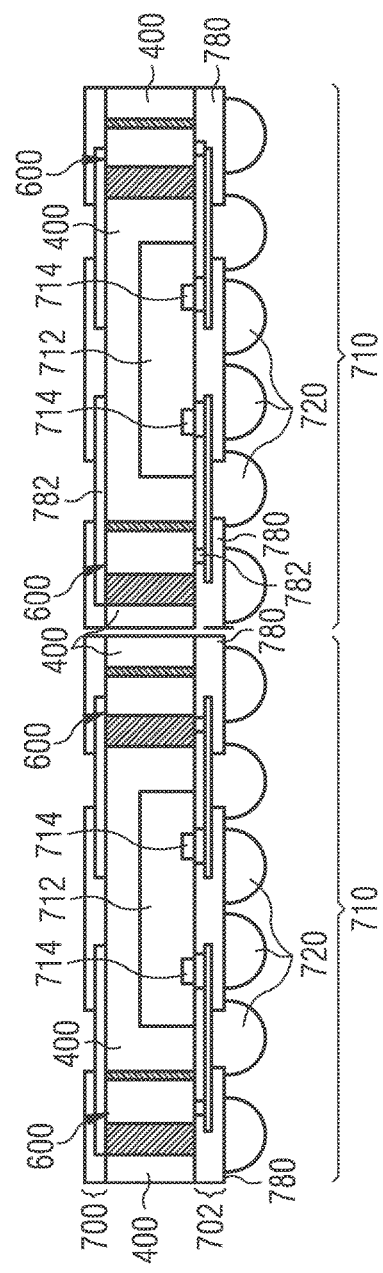

In order to obtain a structure shown in FIG. 16, balling and dicing operations are carried out so as to form solder structures 720 on the redistribution layer 702 and to singularize the individual packages or electronic devices 710 by sawing.

FIG. 17 shows a cross-sectional view of an electronic device 710 according to an exemplary embodiment of the invention manufactured according to FIG. 11 to FIG. 16.

The electronic device 710 according to FIG. 17 comprises the semiconductor package 770 between its first main surface region 772 and its opposing second main surface region 774. The semiconductor package 770 comprises semiconductor chip 712 with its chip pads 714 in the second main surface region 774 and two connector blocks 600 for providing a vertical interconnection between the opposing main surface regions 772, 774 of the semiconductor package 770. The connector blocks 600 comprise first electrically conductive through connections 602 and second electrically conductive through connections 604 extending with different cross-sectional areas A1, A2 between the first main surface region 772 and the second main surface region 774 and are arranged side-by-side with the semiconductor chip 712.

Electronic component 740, which is shown schematically according to FIG. 17, is arranged on the first main surface region 772 and comprises a first electric contact 1700 electrically coupled with one of the connector blocks 600. The electronic component 740 further comprises a second electric contact 1702 electrically coupled with the other connector block 600. The electronic component 740 can be a further semiconductor chip, a passive discrete or chip, an antenna, an electromagnetic radiation shielding structure, etc. According to FIG. 17, there is a continuous electrically conductive path from the first electric contact 1700, a solder structure 720, an electrically conductive layer structure 782 of the redistribution layer 700, one of the connector blocks 600, an electrically conductive layer structure 782 of the redistribution layer 702, and one of the chip pads 714. Correspondingly, there is a continuous electrically conductive path from the second electric contact 1702, a solder structure 720, another electrically conductive layer structure 782 of the redistribution layer 700, the other one of the connector blocks 600, an electrically conductive layer structure 782 of the redistribution layer 702, and the other chip pad 714.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A connector block for providing a vertical interconnection between opposing main surface regions of a semiconductor package, the connector block comprising:
   an encapsulant;
   at least one first electrically conductive through connection, in particular a plurality of first electrically conductive through connections, extending through the encapsulant from a first surface of the encapsulant to a second surface of the encapsulant;
   at least one second electrically conductive through connection, in particular a plurality of second electrically conductive through connections, extending along an exterior third surface of the encapsulant from the first surface of the encapsulant to the second surface of the encapsulant,
   wherein a cross-sectional area of the at least one first electrically conductive through connections is larger than a cross sectional area of the at least one second electrically conductive through connections in a plane perpendicular to a direction extending from the first surface of the encapsulant to the second surface of the encapsulant by a factor of at least 3.

2. A connector block for providing a vertical interconnection between opposing main surface regions of a semiconductor package, the connector block comprising:
   an encapsulant;
   a plurality of first electrically conductive through connections extending parallel to one another through the encapsulant from a first surface of the encapsulant to a second surface of the encapsulant;
   a plurality of second electrically conductive through connections extending parallel to one another and parallel to the plurality of first electrically conductive through connections from the first surface of the encapsulant to the second surface of the encapsulant;
   wherein a cross-sectional area of the first electrically conductive through connections is larger than a cross sectional area of the second electrically conductive through connections in a plane perpendicular to a direction extending from the first surface of the encapsulant to the second surface of the encapsulant by a factor of at least 3.

3. The connector block according to claim 1, wherein the first electrically conductive through connections are configured as at least a portion of at least one of the group consisting of a leadframe, a copper structure, a circumferential frame with a plurality of parallel webs, and a patterned electrically conductive sheet.

4. The connector block according to claim 1, wherein the second electrically conductive through connections are configured as at least one of the group consisting of electroplated structures and sputtered structures.

5. The connector block according to claim 1, wherein a cross-sectional area of the one or more first electrically conductive through connections is larger than a cross sectional area of the one or more second electrically conductive through connections in a plane perpendicular to a direction extending from the first surface of the encapsulant to the second surface of the encapsulant.

6. The connector block according to claim 1, configured as a bar in which at least one of the first electrically conductive through connections and the second electrically conductive through connections are arranged along a linear direction.

7. A method of manufacturing an electronic device with a semiconductor package having a first main surface region and a second main surface region, the method comprising:
   providing a semiconductor chip comprising at least one chip pad in the second main surface region;
   arranging a connector block side-by-side with the semiconductor chip, wherein the connector block comprises at least one first electrically conductive through connection and at least one second electrically conductive through connection extending with different cross-sectional areas between the first main surface region and the second main surface region;
   wherein the cross-sectional area of the at least one first electrically conductive through connections is larger than the cross sectional area of the at least one second electrically conductive through connections in a plane perpendicular to a direction extending from the first surface of the encapsulant to the second surface of the encapsulant by a factor of at least 3.

8. The connector block according to claim 6, wherein the bar has a cuboid structure having a larger extension in one direction than in the other two directions.

9. The connector block according to claim 8, wherein along the longest extension of the bar, the first electrically conductive through connections and the second electrically conductive through connections are arranged in parallel to one another and side-by-side.

10. The connector block according to claim 1, configured as disc-shaped configuration with a circular circumference.

11. The connector block according to claim 1, wherein the first electrically conductive through connections are arranged equidistantly.

12. The connector block according to claim 1, wherein the second electrically conductive through connections are arranged equidistantly.

13. The connector block according to claim 1, wherein the number of first electrically conductive through connections are different from the number of second electrically conductive through connections.

* * * * *